United States Patent [19]
Miyoshi

[11] Patent Number: 5,477,102
[45] Date of Patent: Dec. 19, 1995

[54] PIEZOELECTRIC ACTUATOR AND PROCESS FOR FABRICATING THE SAME

[75] Inventor: Takayuki Miyoshi, Tokyo, Japan

[73] Assignee: NEC Corporation, Japan

[21] Appl. No.: 431,629

[22] Filed: May 1, 1995

Related U.S. Application Data

[63] Continuation of Ser. No. 135,000, Oct. 12, 1993, abandoned, which is a continuation of Ser. No. 839,633, Feb. 21, 1992, abandoned.

[30] Foreign Application Priority Data

Feb. 22, 1991 [JP] Japan ................... 3-028462

[51] Int. Cl.[6] ............................................. H01L 41/08
[52] U.S. Cl. ........................................ 310/344; 310/328
[58] Field of Search ................................ 310/328, 340, 310/344, 346

[56] References Cited

U.S. PATENT DOCUMENTS

| | | | |
|---|---|---|---|
| 4,633,120 | 12/1986 | Sato et al. .................... | 310/328 |
| 5,053,671 | 10/1991 | Kobayashi et al. .......... | 310/344 |
| 5,113,108 | 5/1992 | Yamashita et al. .......... | 310/346 |
| 5,208,506 | 5/1993 | Yamashita .................... | 310/328 |
| 5,239,223 | 8/1993 | Miyoshi ........................ | 310/328 |
| 5,250,868 | 10/1993 | Shirasu ........................ | 310/328 |
| 5,272,797 | 12/1993 | Miyoshi ........................ | 310/328 |

FOREIGN PATENT DOCUMENTS

| | | | |
|---|---|---|---|
| 0088772 | 5/1986 | Japan ............................ | 310/346 |
| 0042183 | 2/1988 | Japan ............................ | 310/328 |

*Primary Examiner*—Thomas M. Dougherty
*Attorney, Agent, or Firm*—Laff, Whitesel, Conte & Saret, Ltd.

[57] ABSTRACT

A piezoelectric actuator includes an electrostrictive effect element, a metal case shaped to be cylindrical for housing the electrostrictive effect element, top and bottom caps for covering top and bottom openings of the metal case, respectively, and locating plates fixed at top and bottom portions of the electrostrictive effect element. The locating plates are set in hollow portions formed at center of the caps, so that the electrostrictive effect element is positioned and fixed at the center of the piezoelectric actuator.

8 Claims, 5 Drawing Sheets

PIEZOELECTRIC ACTUATOR AND PROCESS FOR FABRICATING THE SAME

This application is a continuation of application Ser. No. 08/135,000, filed Oct. 12, 1993 now abandoned, which is a continuation of application Ser. No. 07/839,633, filed Feb. 21, 1992 now abandoned.

FIELD OF THE INVENTION

This invention relates to a piezoelectric actuator and a process for fabricating the same, and more particularly to, a piezoelectric actuator used in a massflow controller, a driver for an X-Y table, an injection molding apparatus, etc., and a process for fabricating the same.

BACKGROUND OF THE INVENTION

A piezoelectric actuator converts electrical energy into mechanical energy by an electrostrictive effect element.

A conventional piezoelectric actuator includes an electrostrictive effect element having a laminated structure, a metal case housing the electrostrictive effect element therein, and a top cap and a bottom cap for covering top and bottom openings of the metal case, respectively. The structure of the electrostrictive effect element is described in the U.S. Pat. No. 4,681,667 issued on Jul. 21, 1987.

The top and bottom caps are shaped to have hollow portions at the center thereof to set ends of the electrostrictive effect element therein, respectively. The metal case is shaped to have wavy surface to be expandable and contractible in a longitudinal direction such as a bellows.

In the conventional piezoelectric actuator, when a predetermine voltage is applied to the electrostrictive effect element, electrostriction is generated therein, so that the piezoelectric actuator expands and contracts to function as a mechanical driving source for a massflow controller, an X-Y table, an injection molding apparatus, etc.

However, the conventional piezoelectric actuator has a disadvantage in that it is difficult to provide an axis alignment between the electrostrictive effect element and each of the top and bottom caps, because the electrostrictive effect element is engaged at the both ends with recesses having predetermined clearances provided on the top and bottom caps, so that shearing stress occurs in the electrostrictive effect element, when the piezoelectric actuator is driven. Therefore, the electrostrictive effect element is broken by the shearing stress.

SUMMARY OF THE INVENTION

Accordingly, it is an object of the invention to provide a piezoelectric actuator in which possibility that an electrostrictive effect element is broken by a shearing stress is decreased, and a process for fabricating the same.

According to a first feature of the invention, a piezoelectric actuator includes:

electrostrictive effect element having first and second ends for converting an electric energy to mechanical energy;

a case for housing the electrostrictive effect element;

first and second caps for sealing top and bottom openings of the case, respectively, and holding the first and second ends of the electrostrictive effect element, respectively;

means for applying an electric field corresponding to the electric energy to the electrostrictive effect element; and at least one resilient alignment member provided between the first cap and the first end of the electrostrictive effect element and/or between the second cap and the second end of the electrostrictive effect element to provide an axial alignment between them.

According to a second feature of the invention, a process for fabricating a piezoelectric actuator comprising steps of:

setting first and second resilient alignment member plates at top and bottom portions of an electrostrictive effect element, respectively;

fixing the first resilient alignment member plate in a recessed portion formed at a center of a first cap;

inserting the electrostrictive effect element in a cylindrical case covered at one of openings with a second cap by an end set by the second resilient alignment member plate;

setting the second resilient alignment member plates in a hollow portion formed at a center of the second cap; and sealing the case and the first and second caps, respectively.

BRIEF DESCRIPTION OF THE DRAWINGS

The invention will be explained in more detail in conjunction with appended drawings; wherein.

DESCRIPTION OF THE PREFERRED EMBODIMENTS

Before describing a piezoelectric actuator according to the invention, the briefly aforementioned conventional piezoelectric actuator will be explained.

Figure 1:
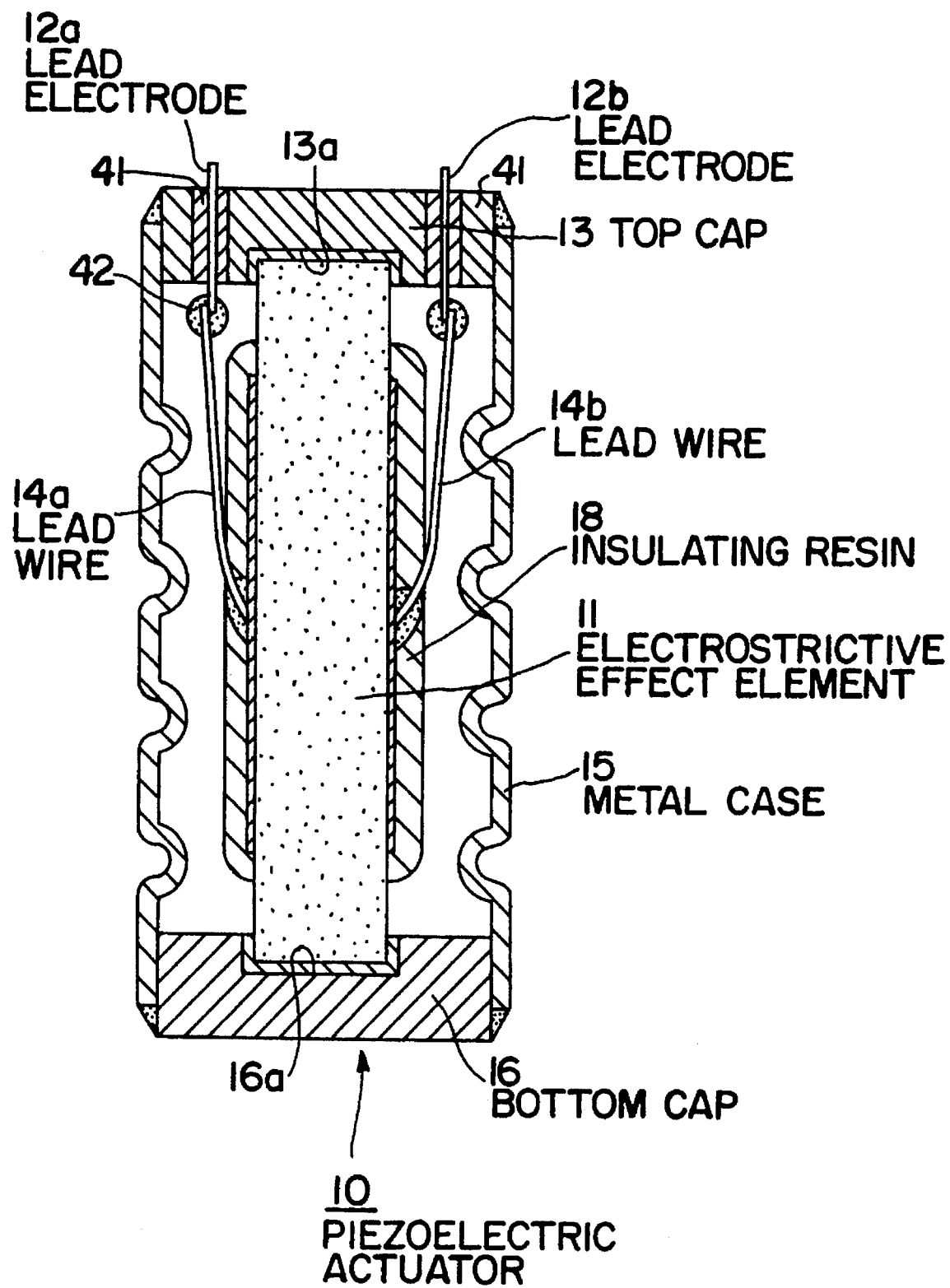
FIG. 1 is a longitudinal sectional view showing a conventional piezoelectric actuator.

FIG. 1 shows a conventional piezoelectric actuator 10. The piezoelectric actuator 10 is shaped to be cylindrical and produces a longitudinal electrostriction. The conventional piezoelectric actuator 10 includes an electrostrictive effect element 11 having a laminated structure, a metal case 15 housing the electrostrictive effect element 11 therein, and a top cap 13 and a bottom cap 16 for covering top and bottom openings of the metal case 15, respectively.

The electrostrictive effect element 11 is made of a plurality of layers of electrostrictive material and a plurality of inner electrodes which are laminated alternately in a longitudinal direction.

The electrostrictive effect element 11 is covered at the side surface with insulating resin 18, and is connected at the side surface with lead wires 14a and 14b by solder. One example of this structure is described in the aforementioned U.S. patent specification and drawings.

The top and bottom caps 13 and 16 are made of stainless steel and are shaped to have hollow portions 13a and 16a at the center thereof to set ends of the electrostrictive effect element 11 therein by use of adhesives such as epoxy resin, respectively. The follow portions 13a and 16a have predetermined clearances relative to a diameter of the electrostrictive effect element 11 because of the rigidity of the caps 13 and 16 and the electrostrictive effect element 11. The top cap 13 is provided with lead electrodes 12a and 12b sealed to the cap 13 by glass 41, and the lead electrodes 12a and 12b are connected with the lead wires 14a and 14b by solders 42, respectively.

The metal case 15 is shaped to have wavy surface to be expandable and contractible in a longitudinal direction such as a bellows, and is welded with the top and bottom caps 13 and 16 to seal the electrostrictive effect element 11 therein.

In the conventional piezoelectric actuator, when a predetermined voltage is applied to the lead electrodes 12a and 12b, electrostriction is generated in the electrostrictive effect element 11. As a result, the piezoelectric actuator operates to expand and contract.

However, the conventional piezoelectric actuator 10 has a disadvantage in that it is difficult to provide an axis alignment between the electrostrictive effect element 11 and each of the top and bottom caps 13 and 16, because the electrostrictive effect element 11 is engaged at the both ends with recesses having predetermined clearances provided on the top and bottom caps 13 and 16, so that shearing stress occurs in the electrostrictive effect element 11, when the piezoelectric actuator 10 is driven. Therefore, the electrostrictive effect element 11 is broken by the shearing stress.

Figure 2:
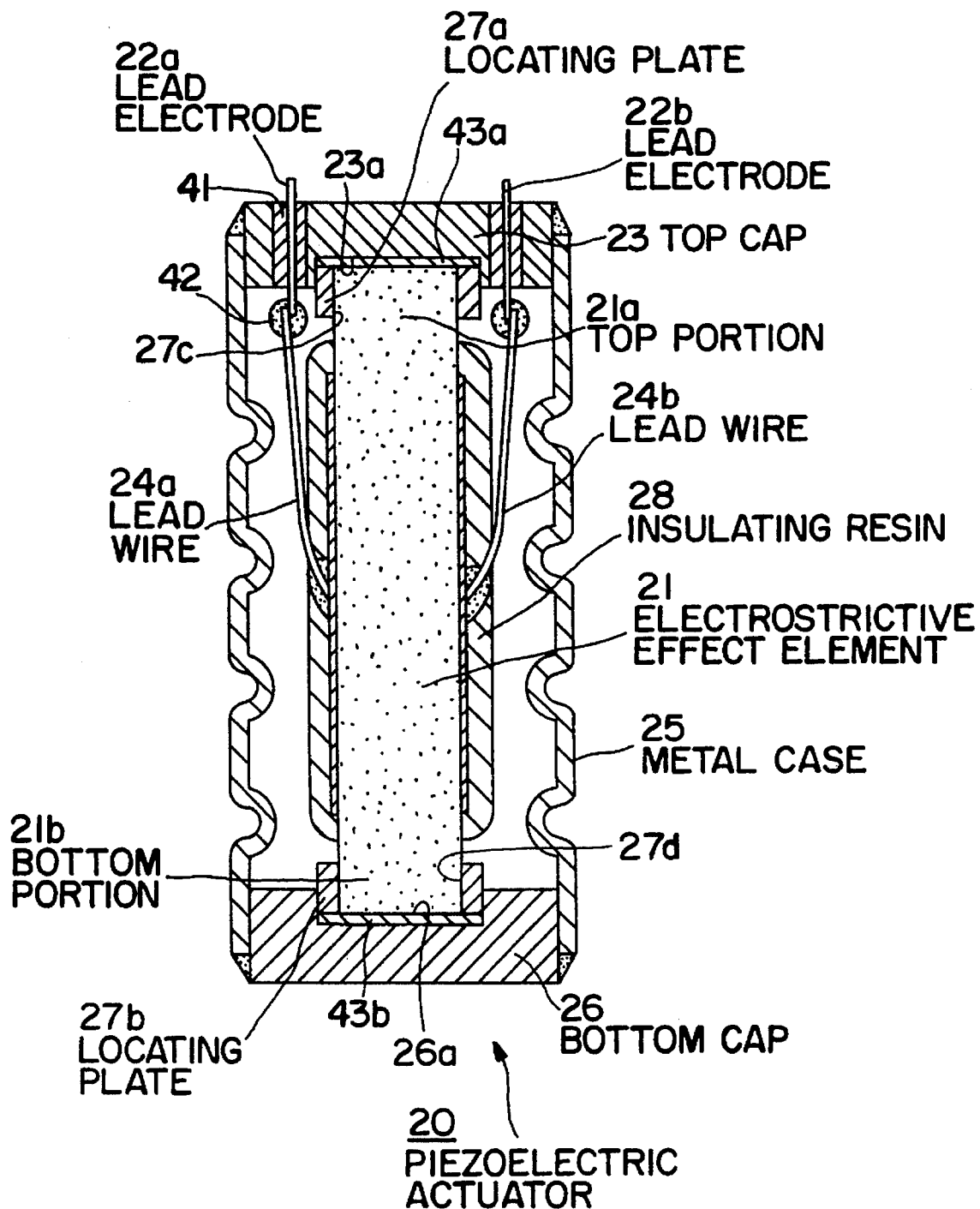
FIG. 2 is a longitudinal sectional view showing a piezoelectric actuator of a first preferred embodiment according to the invention.

FIG. 2 shows a piezoelectric actuator 20 of a first preferred embodiment according to the invention. The piezoelectric actuator 20 includes an electrostrictive effect element 21 having a laminated structure, a metal case 25 housing the electrostrictive effect element 21 therein, a top cap 23 and a bottom cap 26 for covering top and bottom openings of the metal case 25, respectively, and locating plates 27a and 27b into which a top portion 21a and a bottom portion 21b of the electrostrictive effect element 21 are set, respectively.

The electrostrictive effect element 21 is made of a plurality of layers of electrostrictive material and a plurality of inner electrodes which are laminated alternately in a longitudinal direction. The electrostrictive effect element 21 is shaped to be a square pillar covered on the side surface with insulating resin 28, and is connected on the side surface with lead wires 24a and 24b by solder.

The top and bottom caps 23 and 26 are made of stainless steel and are shaped to have hollow portions 23a and 26a at the center thereof to set ends of the electrostrictive effect element 21 therein by use of the locating plates 27a and 27b and adhesives 43a and 43b, respectively. The hollow portions 23a and 26a are shaped to have an inside diameter having a clearance of 0.01 μm to 0.05 μm to an outside diameter of the locating plates 27a and 27b, and having a depth of half the thickness of the locating plates 27a and 27b, respectively. The top cap 23 is provided with lead electrodes 22a and 22b sealed to the top cap 23 by glasses 41, and the lead electrodes 22a and 22b are connected with the lead wires 24a and 24b by solders 42, respectively.

The metal case 25 is made of stainless steel and is shaped to have wavy surface to be expandable and contractible in a longitudinal direction such as a bellows, and is welded with the top and bottom caps 23 and 26 to seal the electrostrictive effect element 21 therein.

Figure 3A:
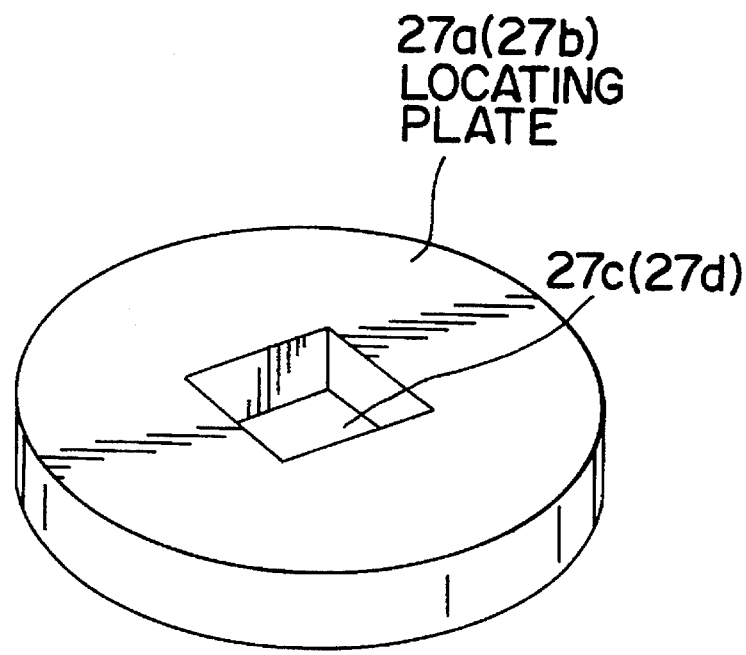
FIGS. 3A and 3B are perspective view showing locating plates of the first preferred embodiment, respectively.

FIG. 3A shows the locating plates 27a (27b). The locating plates 27a and 27b are made of glass-epoxy or aluminium preferably having elasticity, shaped to be disklike and to have a thickness of 0.2 mm to 2.0 mm, respectively. And the locating plates 27a and 27b have 5 mm square holes 27c and 27d at the center in which the top and bottom portions 21a and 21b of the electrostrictive effect element 21 are set and fixed, respectively.

Figure 3B:
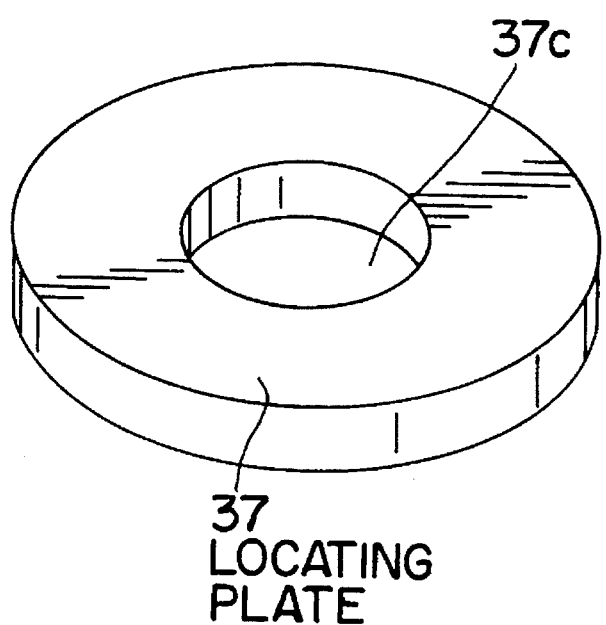

FIG. 3B shows another locating plate 37 having a circular hole 37c which is used for an electrostrictive effect element shaped to be cylindrical.

In fabrication, multi-component solid-solution state powder ceramic of perovskite structure is mixed with organic binder to form a green sheet having a thickness of 100 μm. Next, the green sheet is coated on its surface with a conductive material made of silver paste which is then dried. After that, ten layers of the green sheets thus coated with the conductive material are laminated to make a laminated structure, for example sixty four layers which is then sintered. The inner conductive material layers which are exposed on side surfaces of the laminated structure and selectively covered with glass insulating film (not shown), and two outer electrodes are provided on the sides of the laminated structure to be connected to the inner conductive material layers on alternate layers to form two combshaped electrodes. Next, the lead wires 24a and 24b are connected with the outer electrodes by solder, and the side surface of the electrostrictive effect element 21 is covered with the insulating resin 28. Thus, the electrostrictive effect element 21 is fabricated.

Figure 4:
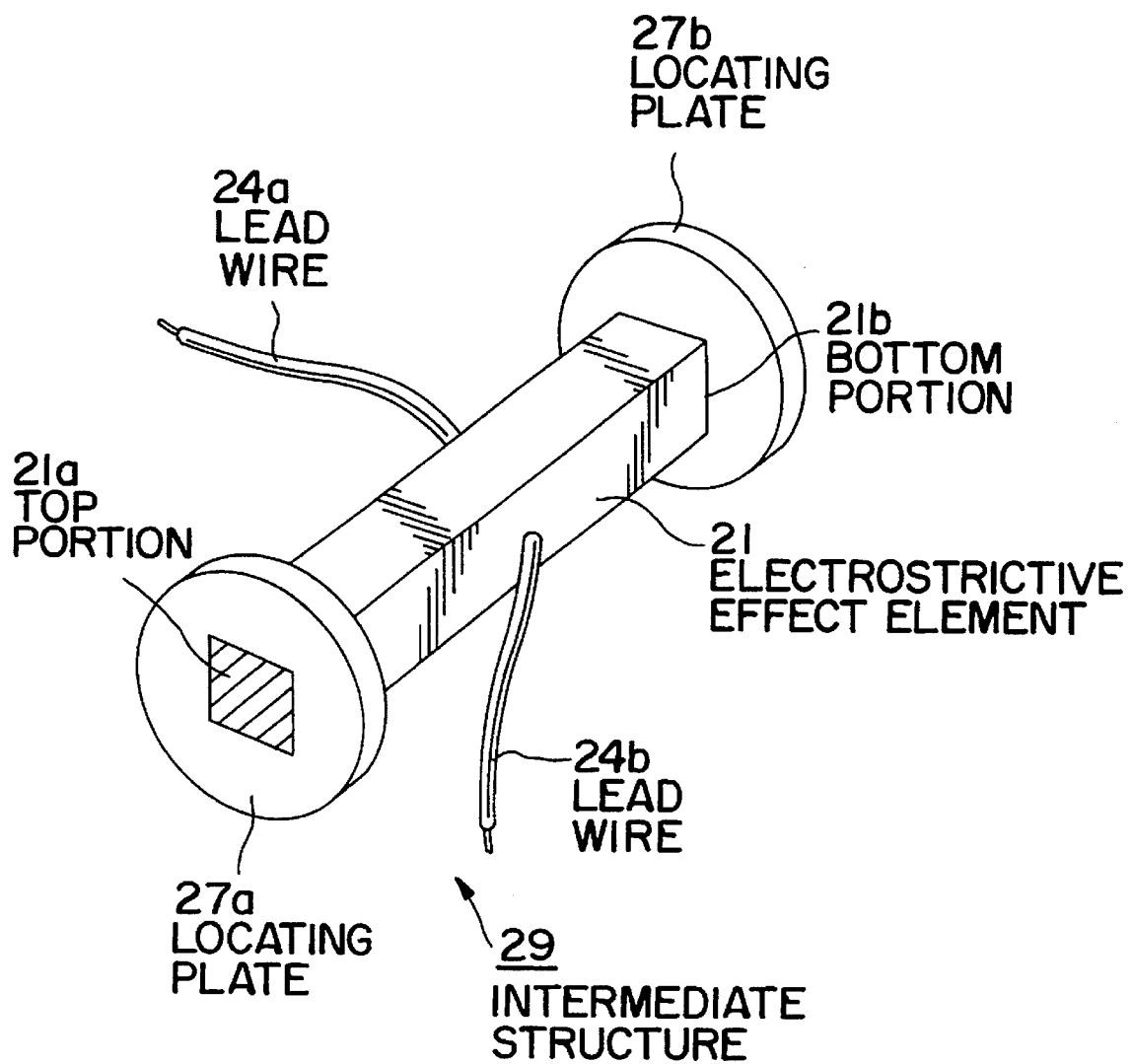
FIG. 4 is a perspective view showing an intermediate structure of the piezoelectric actuator of the first preferred embodiment.

The electrostrictive effect element 21 is inserted in the holes 27c and 27d of the locating plates 27a and 27b by the top and bottom portions and fixed therein, respectively, so that an intermediate structure 29 shown in FIG. 4 is fabricated.

Next, the locating plate 27a is set in the hollow portion 23a of the top cap 23 and they are fixed by the adhesive 43a such as epoxy resin, and the lead wires 24a and 24b are soldered with the lead electrodes 22a and 22b by the solders 22, respectively. At this time, the axial alignment is realized between the cap 23 and the electrostrictive effect element 21 by use of the elasticity of the locating plate 27a. Next, the intermediate structure 29 is inserted in the metal case 25 covered at the bottom opening with the bottom cap 26 by welding, and the locating plate 27b is set and attached in the hollow portion 26a of the bottom cap 26 by the adhesive 43b such as epoxy resin. Finally, the bottom cap 26 and the metal case 25 are sealed by welding. Thus, the piezoelectric actuator 20 is fabricated. Even at this time, the elasticity of the locating plate 27b allows the axial alignment between the element 21 and the cap 26.

In operation, when a predetermined voltage is applied to the lead electrodes 22a and 22b, electrostriction is generated in the electrostrictive effect element 21. As a result, the piezoelectric actuator 20 operates to expand and contract.

In this occasion, shearing stress occurring in the electrostrictive effect element 21 is decreased, because the electrostrictive effect element 21 is precisely aligned and fixed at the center of the piezoelectric actuator 20 by the locating plates 27a and 27b.

Figure 5:
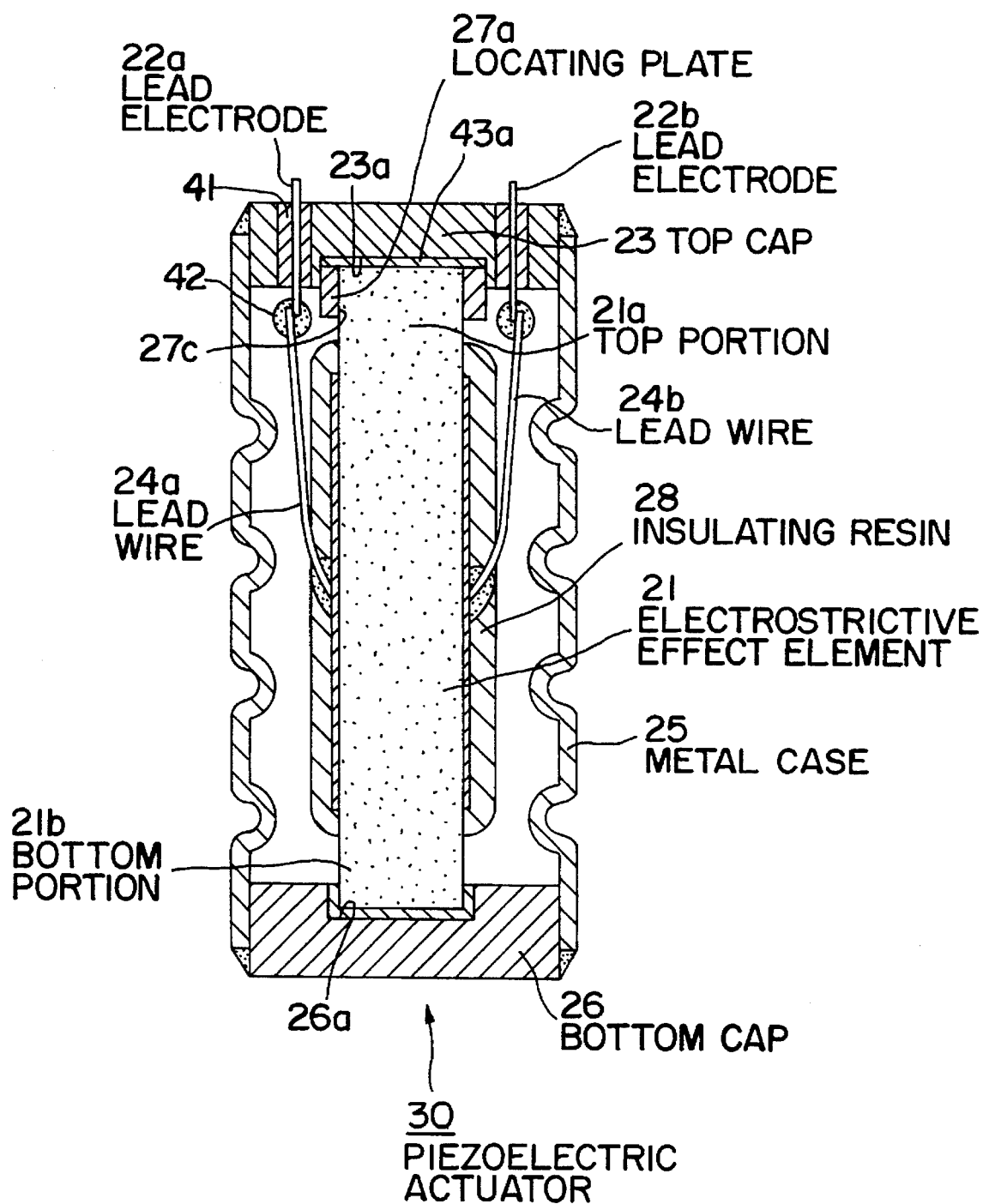
FIG. 5 is a longitudinal sectional view showing a piezoelectric actuator of a second preferred embodiment according to the invention.

FIG. 5 shows a piezoelectric actuator 30 of a second preferred embodiment according to the invention. The piezoelectric actuator 30 is only provided with a locating plate 27a at a top portion of an electrostrictive effect element 21, and not provided at a bottom portion thereof. Other components correspond with those of the first preferred embodiment. According to the second preferred embodiment, the structure is simplified and the fabrication steps are more decreased than the first preferred embodiment.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A piezoelectric actuator, comprising:

a square pillar of an electrostrictive effect element for converting electric energy into mechanical energy and having first and second square-shaped ends;

a case for housing said electrostrictive effect element;

first and second end caps for sealing top and bottom openings of said case, respectively, said first and second end caps having a circular recessed portion having a periphery with particular dimensions for accommodating said first and second ends of said electrostrictive effect element, respectively;

means for applying electric energy to said electrostrictive effect element; and first and second circular alignment disks respectively located in said circular recessed portion of said first and second caps, said disks having a periphery with a second dimension which provides a peripheral clearance space between said disks and said recessed portion, said clearance space being free of adhesives, each of said disks having a square-shaped opening to receive and precisely locate said first and second ends of said electrostrictive effect element, respectively, whereby said disks enable said electrostrictive effect element to self align.

2. A piezoelectric actuator, comprising:

an electrostrictive effect element for converting electric energy into mechanical energy, said electrostrictive element having first and second ends;

a case for housing said electrostrictive effect element;

first and second end caps for sealing top and bottom openings of said case, respectively, each of said first and second caps having a circular recessed portion for receiving said first and second ends of said electrostrictive effect element, respectively;

means for applying an electric field corresponding to said electric energy to said electrostrictive effect element; and at least one alignment disk in said recessed portion of said first cap, there being an adhesive free clearance Space between said disk and said recessed portion, said alignment disk having an aperture into which one of said first and second ends of said electrostrictive effect element is fixed, and said alignment disk being thicker than a depth of said recessed portion of said first cap.

3. A piezoelectric actuator of the claim 2 wherein said aperture of said alignment disk has a square cross-section, and said first and second ends of said electrostrictive element have a similar square cross-section dimensioned to fit within said aperture.

4. A piezoelectric actuator, comprising:

an electrostrictive effect element for converting an electric energy into mechanical energy and having first and second ends;

a case for housing said electrostrictive effect element;

first and second caps for sealing top and bottom openings of said case, respectively, said first and second caps having first and second recessed portions, respectively, to accommodate said first and second ends of said electrostrictive effect element;

an alignment disk in at least one of said recessed portions to precisely locate and fix a position of at least one of said ends of said electrostrictive effect element, there being a peripheral clearance space free of adhesives between said disk and said recess; and adhesive means outside said clearance space and in a bottom of said recess for fixing a bottom edge of said alignment disk and said at least one end of said electrostrictive effect element in said recessed portions.

5. A piezoelectric actuator according to claim 4, wherein said first and second caps are made of stainless steel and said alignment disk is a resilient alignment member made of a material selected from a group consisting of epoxy resin and aluminum.

6. A piezoelectric actuator according to claim 4, wherein each of said first and second recessed portions has a circular cross sectional shape, and said alignment disk has a circular cross sectional shape fitting into and fixed within at least said first recessed portion.

7. A piezoelectric actuator of any one of the claims 2–6 wherein said recessed portion of said first cap has a depth which is equal to one half the thickness of said alignment disk.

8. A piezoelectric actuator of any one of the claims 2 or 4, wherein said aperture of said disk has a circular cross-section dimensioned to fit within said aperture.

* * * * *